United States Patent [19]

Alvarez, III et al.

[11] 4,357,700

[45] Nov. 2, 1982

[54] ADAPTIVE ERROR ENCODING IN MULTIPLE ACCESS SYSTEMS

[75] Inventors: Joseph A. Alvarez, III, Damascus; Bruce D. Gobioff, Wheaton, both of Md.; Lynn P. West, Austin, Tex.

[73] Assignee: International Business Machines Corp., Armonk, N.Y.

[21] Appl. No.: 932,579

[22] Filed: Aug. 10, 1978

[51] Int. Cl.³ .............................................. H04J 3/16
[52] U.S. Cl. ..................................... 370/83; 370/79; 370/84; 370/104
[58] Field of Search ........ 179/15 BS, 15 BA, 15 BW, 179/15 BV; 340/146.1 AX; 325/41, 4; 370/83, 79, 84, 104

[56] References Cited

U.S. PATENT DOCUMENTS

| | | | |
|---|---|---|---|
| 2,962,213 | 11/1960 | Namian | 179/15 BA |
| 3,207,851 | 9/1965 | Fukinuki | 179/15 BY |
| 3,591,722 | 7/1971 | Palsa | 179/15 BY |
| 3,700,820 | 10/1972 | Blasbalg | 179/15 BV |
| 4,009,344 | 2/1977 | Flemming | 179/15 BS |
| 4,047,151 | 9/1977 | Ryobeck | 325/41 |

OTHER PUBLICATIONS

Ericsson Technics, No. 4, 1975, "Techniques for Introducing Error Correcting Codes..." by Ryobeck et al.

*Primary Examiner*—David L. Stewart
*Attorney, Agent, or Firm*—R. Lieber

[57] ABSTRACT

In a time division multiple access (TDMA) system, for "multi-path" data communication via satellite repeater, the form of transmitted data is varied adaptively to maintain error-free transmission under varying noise conditions. Adjustments are made on a path selective and channel selective basis to protect only the most vulnerable data in specific transmission paths experiencing noise deterioration. Accordingly any multi-channel burst may contain channels of data in both protected and unprotected forms. A predetermined portion of each channel containing data in unprotected format is used explicitly to designate the destination of the accompanying data and implicitly to distinguish the data format as unprotected. In protected format data including error protective coding is transmitted in two contiguous channels along with information in the first channel explicitly distinguishing the protected format. This format-distinguishing information occupies the space allotted in the unprotected format for designating the data destination. The destination of protectively encoded data is explicitly designated in a separate predetermined space in the associated double-channel slot.

23 Claims, 8 Drawing Figures

VOICE, DATA & SIGNAL CHANNELS

CHANNEL FORMAT "UNPROTECTED" DATA

CHANNEL FORMAT ERROR-PROTECTED DATA

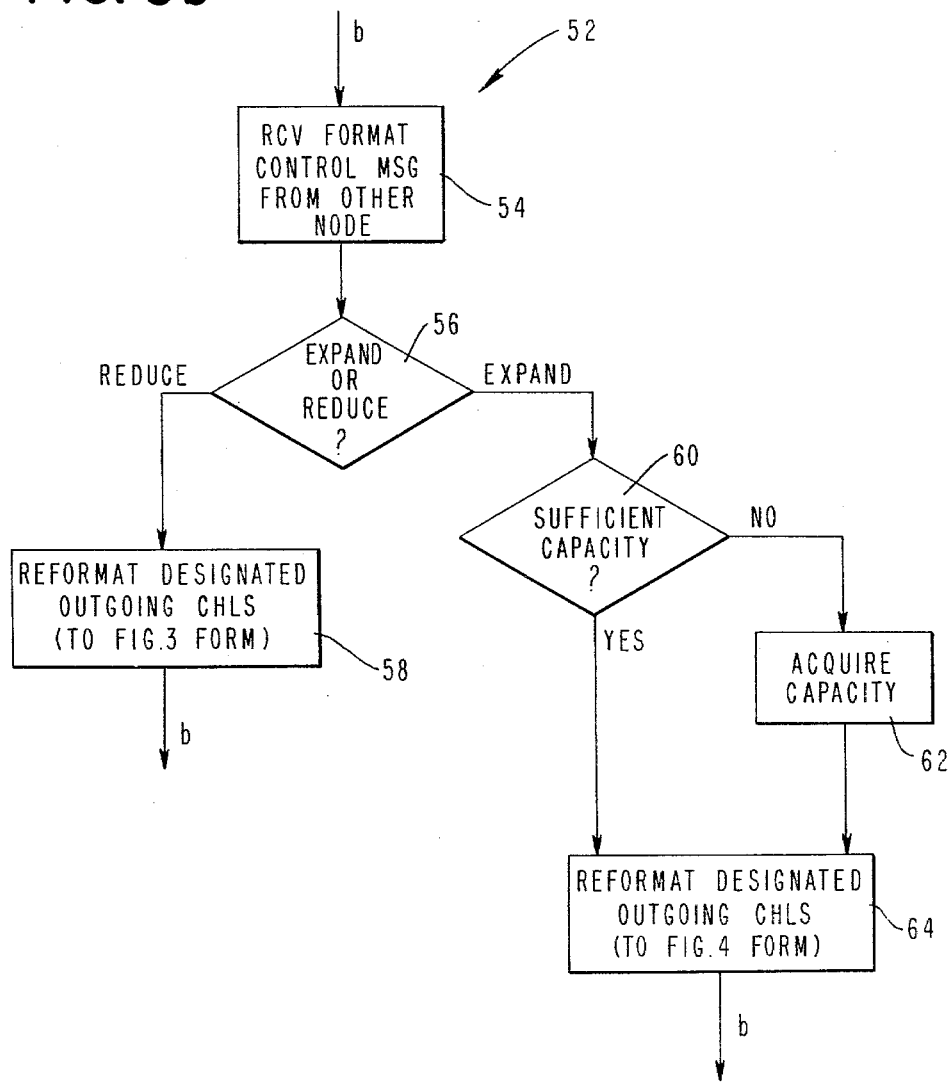

ADAPTIVE ERROR ENCODING IN MULTIPLE ACCESS SYSTEMS

FIELD OF THE INVENTION

This invention relates to systems for maintaining error-free transmission in selected communication channels of a multiplex data communication system.

An object of the invention is to provide an efficient system for maintaining error-free transmissions of multiplexed data under varying noise conditions; in which the form of transmitted data in selected channels of multi-channel bursts or frames can be varied on a selective basis as a function of the relative importance of the data, its vulnerability to error, and the available channel capacity.

Another object is to provide an efficient control signalling method, in association with variably formatted channels of multiplexed data undergoing transmission to various destinations; whereby both the destination of the data in each channel and its format can be efficiently and unambiguously distinguished.

Another object is to provide an efficient, unambiguous and reliable system for varying the code format of error-vulnerable data to adapt to varying noise conditions in individual radio transmission paths between a satellite repeater and multiple earth stations operating in TDMA mode.

Another object is to provide a system responsive to varying noise conditions for adjusting the form of data in individual channels of multiple-channel data bursts passing bidirectionally between a satellite repeater and network of earth stations operating in TDMA mode; said system being capable of varying the form of data selectively in any channel and in either or both directions of burst passage relative to any earth station.

BACKGROUND PRIOR ART

Known systems for maintaining error-free transmission of multiplexed data under varying noise conditions generally operate to vary entire frame formats rather than formats of individual data channels in frames. For example a system disclosed in U.S. Pat. No. 3,534,264 to Blasbalg et al operates to vary the code and bit rate formats of data in multiplex frames; each format change being indicated by control signals sent in the frame preceding the change. The receiver/demultiplexer responds to the control signals and adjusts its reception to the changes in transmission format. When a transmission format change involves a change in bit timing the receiver adjusts its demodulation circuits to adapt to the varied bandwidth of the data and its bit reception clocking to adapt to the altered bit timing.

This may be inefficient inasmuch as some data may be less affected by noise than other data. For instance digitized voice telephone samples may be received intelligibly in the presence of noise which can render much computer process data useless.

The present invention operates more efficiently by varying data formats in multiplexed channels on a channel-selective basis taking into account the nature of the data being sent in each channel, its vulnerability to noise and the channel capacity available for transmission. Control signals accompanying the data enable any receiving station to distinguish the format of data in each transmitted channel. By arranging these control signals to designate various destinations of data in the channels an added measure of efficiency is realized. By encoding these control signals invariably in an error correction code, regardless of noise conditions, a more reliable system is achieved.

Considered in relation to TDMA (time division multiple access) systems of the type described in U.S. Pat. No. 4,009,344 to D. Flemming, the technique described in the Blasbalg et al patent has other shortcomings which are avoidable by the present invention. In such TDMA systems bursts of time multiplexed data originated by multiple exchange stations interleave in time at a satellite repeated and return to all stations as a time division composite of bursts. Individual bursts may contain multiple data channels having various origins relative to subscriber ports of their respective transmitting stations and various destinations relative to subscriber ports of the receiving stations. Each station has buffer storage capacity only for received data destined for exchange transfer to its associated ports. Such data usually represents only a small fraction of the total channel capacity in the received composite. Therefore it must immediately be distinguished and extracted while the composite is being received.

In the system described in the Blasbalg et al patent one station receives and demultiplexes all multiplexed data transmitted by another single station. In response to varying noise detected by the receiving station, and control messages communicated back to the transmitting station, the transmitting station varies its frame format; indicating each format change to the receiving station by an advance control signal. If this technique were used in a TDMA system environment a first station receiving and extracting one channel out of a multiple channel burst sent by a second station could influence the second station to modify its entire burst format merely to protect the one channel handled at the first station. In this same example if the first station is also receiving and extracting fractional parts of bursts sent by third and fourth stations the first station could also potentially influence the burst formats of the second, third and fourth stations to the potential detriment of communications between those stations and many other stations.

The present invention avoids such potentially inefficient use of system bandwidth by adapting the stations to be able to alter data formats in individual channels of associated transmission bursts on a selective basis. The data coding in the channels is varied without changing bit rates so that reception demodulation and bit clocking adjustments are unnecessary.

BRIEF DESCRIPTION OF THE DRAWINGS

In the accompanying drawings:

FIGS. 5a and 5b illustrate station processes for varying channel formats selectively, in response to varying environmental noise conditions, to adapt individual

DESCRIPTION OF THE INVENTION

Although the present invention is considered susceptible of useful application in many communication system environments it is considered particularly useful in so-called multiple access systems. In such systems multiple stations communicate simultaneously via a shared satellite repeater. A preferred embodiment of the invention will now be described in relation to one such system in which the stations operate in the so-called time division multiple access (hereinafter TDMA) mode.

Figure 1:
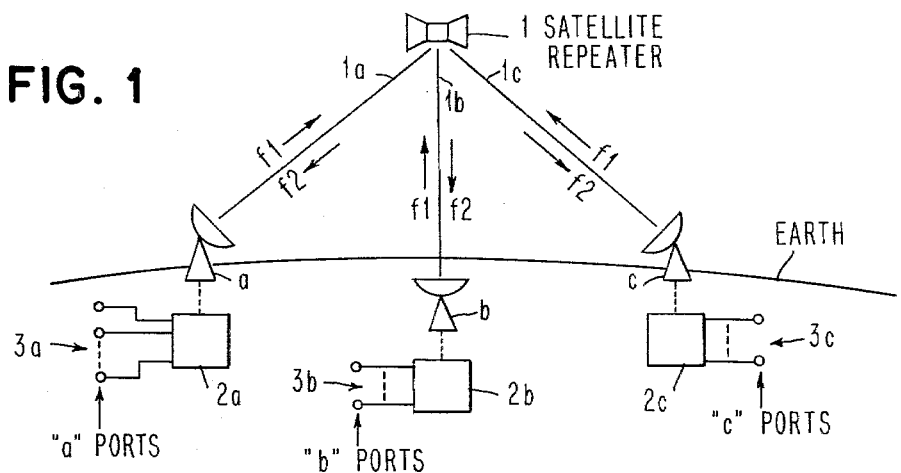
FIG. 1 schematically illustrates a TDMA network in which the invention may be employed advantageously.
Figure 2:
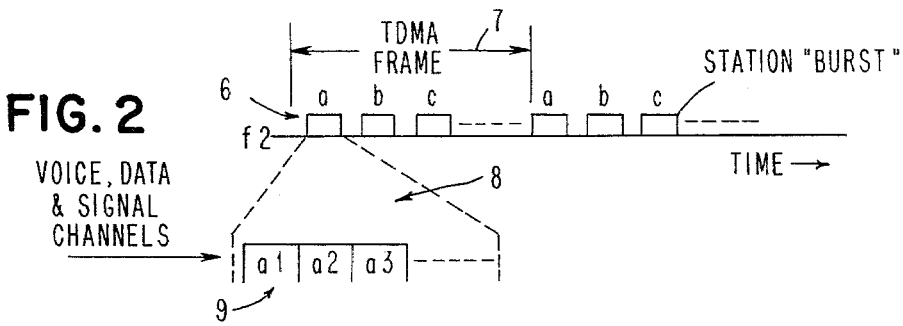
FIG. 2 schematically represents the format of station bursts and burst channels in the composite of interleaved bursts formed at the satellite repeater in the environmental system of FIG. 1.

As suggested in FIGS. 1 and 2, in TDMA mode earth stations a, b, c, . . . , operate concurrently to transmit bursts of radio frequency energy on a shared carrier frequency band f1. These bursts are directed to satellite repeater 1 in respective radio transmission paths 1a, 1b, 1c, . . . . Each burst is modulated by signals which represent multiple information samples, usually in digital form. The bursts of the various stations (a, b, c, . . . ) are timed to interleave at the satellite in a predetermined time sequence, as suggested in FIG. 2. Transponder apparatus in the satellite repeater translates the carrier frequency band of the incoming bursts from band f1 to band f2, separate from f1, while preserving the information carried as modulation on the bursts. The composite of interleaved bursts carried on f2 is transmitted (usually omnidirectionally) from the repeater to all stations. At the stations the interleaved composite is demodulated, demultiplexed, and processed to extract from the demultiplexed information the information intended to be processed at the respective station.

Each station burst may contain information samples from multiple sources in multiple time separated (time division multiplex) channels. Consequently, the composite returned from the satellite may be viewed as a two-dimensional multiplex of time-separated bursts and of time-separated channels within bursts. In this composite the individual channels may have various station destinations and various port (line) destinations external to the stations. At each station exchange apparatus 2a, 2b, 2c, . . . , operates adaptively to form connective switching associations between multiple source/destination ports, 3a, 3b, 3c, . . . , and individual time channels in the bursts to the satellite.

Referring to FIG. 2 the bursts 6 interleave at the satellite in TDMA burst frames 7, the carrier frequency band is transponded from f1 to f2, and the interleaved composite is broadcast to all stations. As suggested at 8 any burst, such as the "a" station burst, may contain multiple time separated channels 9 of digital information samples which have different port origins such as a1, a2, a3, . . . , and various port destinations (not shown).

Station ports 3a, 3b, 3c, . . . , (FIG. 1) are variously associatable with voice telephone lines and digital communication lines. Analogue voice telephone signals on the telephone lines may be converted between analogue and digital (delta modulated) forms in transit between respective lines and the associated station exchange apparatus. In the associated exchange apparatus, 2a, 2b, 2c, . . . , the digital voice and data samples received from the ports for transmission ("uplink") processing relative to the satellite repeater 1 are stored in buffer stores until multiple samples (480 bits) have been accumulated relative to each connectively associated port. At appropriate intervals, synchronized with burst, channel and bit time slots in frames 7, contents of these buffer stores are selectively retrieved and transmitted to the satellite in the form of time compressed modulation carried on the respective station's burst.

In the reverse ("downlink") direction the composite of interleaved bursts is processed in the exchange apparatus, 2a, 2b, 2c, . . . , to demodulate the information channels and to separate channels scheduled for handling by or through respective exchanges from other channels not so scheduled. The information in the other channels must be discarded since the available buffer storage capacity in each exchange is only sufficient to accommodate the information traffic directed to the respective station and its ports. The separated samples are demultiplexed and routed switchably to exchange control circuits and destination ports of the respective station.

Station exchanges of this kind, as described in the above-referenced U.S. Pat. No. 4,009,344 to Flemming, may include a facility for activity compression. Such a facility allots burst transmission channels only to voice telephone samples which represent intelligible activity at associated ports; such allotment being similar to the TASI (time assigned speech interpolation) channel allotment procedure used in conventional telephone systems. As described in the Flemming patent, systems of this kind may also contain a demand assignment facility for varying the burst timing allotments (channel capacity) of the participating stations in accordance with demand and utilization activity of the stations. The preferred embodiment of the invention is conveniently adaptable to be used in association with such activity compression and demand assignment facilities, and this aspect of the invention will be understood as the following description develops.

In the system described in the above-referenced patent to Flemming associations between switching channels in the exchange and channel time slots in the satellite bursts are indicated by activity compression masks which are communicated in the bursts and by tables of exchange association maintained in the exchange apparatus 2a, 2b, 2c, . . . The preferred embodiment of the present invention as presently described operates with a different channel routing procedure. Each channel time slot in the present embodiment consists of 512 bit time slots. Under noise-free conditions the 512 bit slots of a channel are occupied by 32 bits of address information 11 in the leading 32 bit slots, which serve to designate the destination of data bits or voice telephone information bit samples 12 contained in the remaining 480 bit slots. In such "normal" channels the data bits 12 invariably have one origin and are directed invariably to the same destination (or destinations) designated by the associated address 11.

Figure 3:
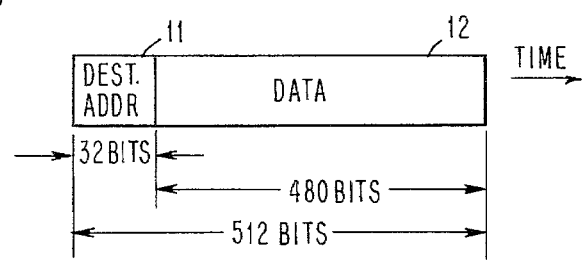
FIG. 3 illustrates the format of burst channels containing data in unprotected format in a burst configured in accordance with the present invention.

In accordance with the present invention, under "noisy" or other conditions determined in a manner described below, the information in certain selected channels may be arranged in the "protected" form suggested in FIG. 4. In this form a block of 480 data bits having a common origin and destination is encoded in a double redundancy (16,8) forward error correction (FEC) code and occupies 960 bit slots 21 in the 1,024 bit slot capacity of a pair of burst time channels. In this "2-channel" format the first 32 bit slots in the first channel are occupied by a 32-bit flag representation 22 which signifies the protected code format and "2-channel" configuration of the accompanying data 21. The next 32 bit slots 23, following the flag 22, contain destination address information corresponding to the address information 11 in the "normal" (unprotected) channel format of FIG. 3. In both the unprotected format of FIG. 3 and the protected format of FIG. 4, the destination addresses 11 and 23 are encoded in a double redundancy (16,8) code having a range of code values exceeding the maximum anticipated destination addressing range of the system. One of the spare values in this range is used to represent the flag function 22 mentioned above. Consequently the destination addresses 11 implicitly distinguish the unprotected format of FIG. 3 and the flags 22 explicity distinguish the protected format of FIG. 4. It should be noted that the flag 22 and address 23 fit exactly into the two channel configuration because only the data is expanded in length in this format. It is also noteworthy that in both the format of FIG. 3 and the format of FIG. 4 the data bits have identical durations. Consequently the bit rate and modulation band utilization of the system are identical for both formats.

Noise Detection

As indicated in the above-referenced patent to Flemming station exchange apparatus such as 2a, 2b, 2c, . . . may comprise common control computer apparatus programmable to perform many processes relative to information communicated via the satellite. One such process is a station synchronization process in which certain bursts transmitted by one of the stations, predesignated as a master or reference station, contain timing reference signals for synchronizing the transmissions of all stations (e.g. to a common TDMA frame such as 7, FIG. 2). These reference signals may be encoded in a double redundancy (16,8) code and the computing apparatus in each station may be adapted to monitor the rate of error occurrences in such signals. This "bit error rate" (hereafter BER), may be used presently to control the transmission of data in the formats of FIGS. 3 and 4 on a channel selective basis.

By conventions not relavent to the present invention, the reference station monitors its own synchronizing signals and continues to operate as reference station only so long as the BER which it detects is within a predefined acceptable limit. When this limit is exceeded, the system may be reconfigured (again by means not relevant to the present invention) to enable one of the formerly subordinate stations to operate as a reference station.

Figure 4:
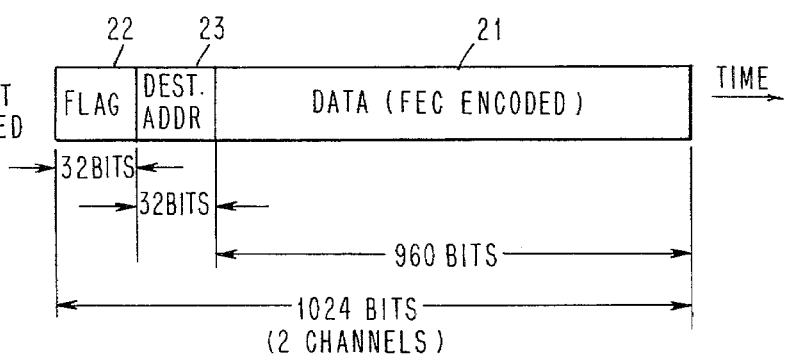
FIG. 4 illustrates the format of paired channels containing protectively encoded data in accordance with the present invention.

When the BER monitored at any subordinate station (access node) in the signals received from the reference station exceeds a prearranged limit, the computing apparatus at the subordinate station initiates programmed operations to select individual data channels for communication in the expanded channel format of FIG. 4 and to restore such channels to normal format (FIG. 8) when BER conditions are suitable. This program process is indicated diagrammatically in FIGS. 5a and 5b.

In the type of multiple access system presently under consideration the energy transmitted from the repeated to any node is dispersed and weak in comparison to the energy directed from that node to the repeater. Consequently environmental conditions responsible for intermittent signal deterioration at a node will generally affect incoming channels at that node more adversely than outgoing channels. Accordingly, in making the foregoing data channel selection (for reformatted communication) incoming channels should be given preference over outgoing channels.

Figure 5A:
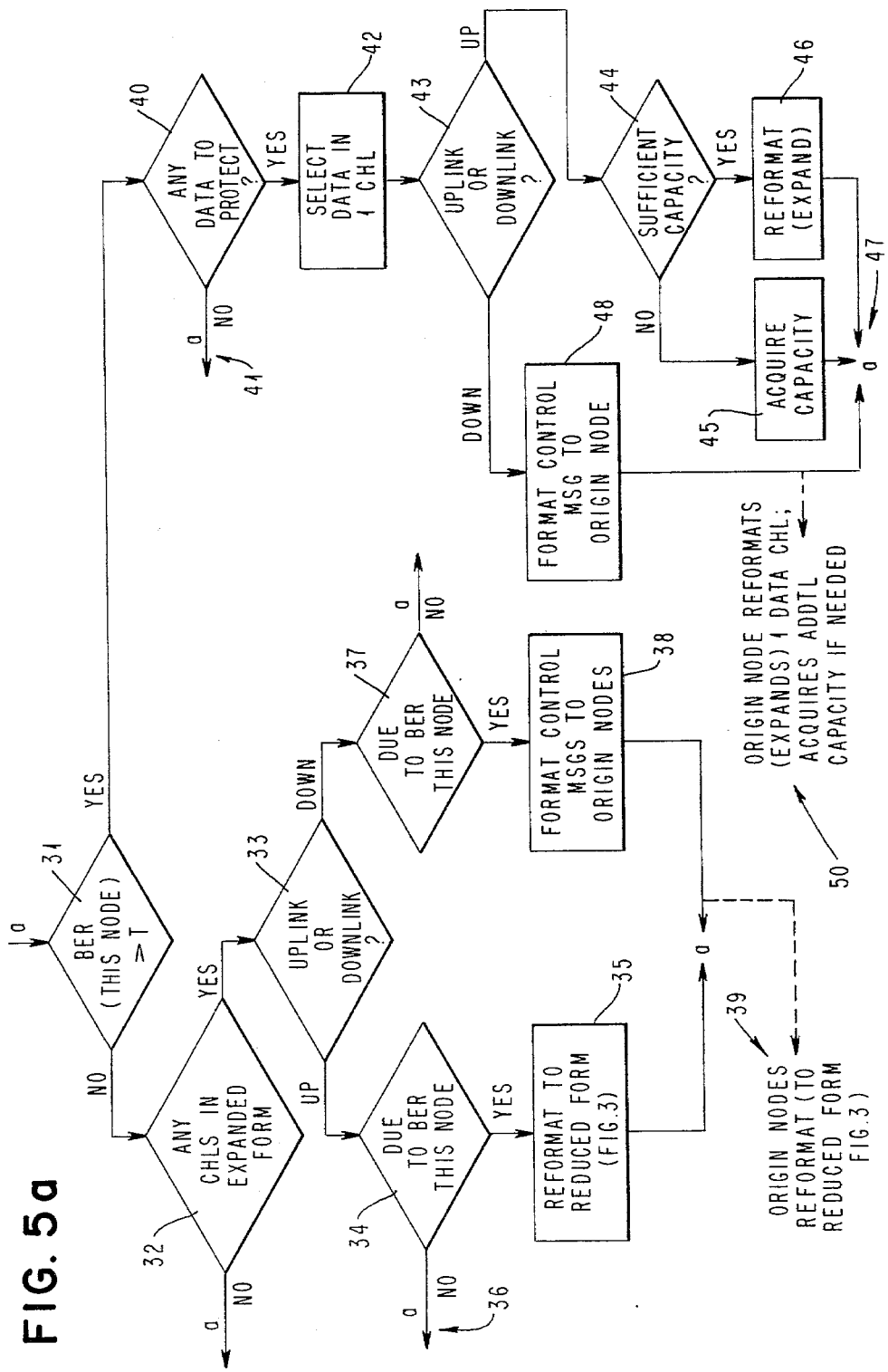

According to FIG. 5a each station continually monitors the BER in the associated linkage path 1a, 1b, 1c, . . . and as suggested at 31 determines if it exceeds the predefined limit T (for acceptable transmission in noise-sensitive data channels). If the BER does not exceed T, the program determines at 32 whether any channels processed by this station are in the expanded (protected) format of FIG. 4. If no channels are in expanded format, no specific action is taken and the station apparatus continues to monitor the respective BER as explained previously; returning via process path "a" to decision point 31.

If any channels are in the expanded format of FIG. 4, the station computing apparatus determines at 33 whether such channels may be restored to normal (FIG. 3) form by this station. This depends on whether such channels are outgoing (uplink) or incoming (downlink). Relative to outgoing channels the station apparatus determines at 34 whether the affected channels have been arranged in expanded format due to locally initiated action (in response to excessive "local" BER conditions) or in response to control messages received from remote destination stations requesting such format changes in reaction to BER conditions detected at respective remote nodes. Outgoing channels in expanded format due to locally determined noise conditions may be directly reformatted to the reduced (unprotected) form of FIG. 3 as suggested at 35. Channels in expanded format due to control message communications (from remote destination stations experiencing high BER conditions) are not affected at this point, as suggested at 36.

Relative to determinations at 33 that channels in expanded format are incoming (downlink), a determination is made at 37 as to the "cause" of the format (BER conditions at the origin node or BER conditions at this receiving node indicated previously in a control message sent from this node to the origin code). Incoming channels which are in expanded format due to local BER conditions at this destination node are reformatted to reduced (FIG. 3) form by transmission of format control messages 38 to respective origin nodes and by responsive actions 39 at the origin nodes. Incoming channels which are in expanded format due to BER conditions at other nodes are not affected at decision point 37.

Upon determining at 31 that local BER conditions at this station node exceed the defined limit T decision branch 40 is taken as a function of the type of data currently being communicated. If the recoverability of information in all channels currently being communicated relative to this node is not adversely affected by errors no reformatting action is required and no action is taken as suggested at 41. If, however, at least one data channel requires protective encoding the station computing apparatus selects one such data channel for reformatted handling subject to availability of communication channel capacity for handling the additional bits. As noted above in respect to such selection incoming channels should be given preference over outgoing channels. Furthermore the relative vulnerabilities of the data channels may be tabulated and the selection may be conditioned further on such relative vulnerability.

The channel thereby selected is processed for communication in expanded (FIG. 4) format as suggested at 42. At 43 a program decision is made as to whether the selected channel is outgoing (uplink) or incoming (downlink). If an outgoing channel is selected a determination is made at 44 as to whether the allotted channel capacity is sufficient to sustain the expanded format (i.e., whether an additional channel is available to accommodate the expansion). If the present alotted capacity in the burst is insufficient, additional capacity is acquired as suggested at 45 (by means of control communications and associated operations of the demand assignment facility previously discussed). If sufficient capacity is available, the data in the selected channel is encoded for transmission in the two channel (FIG. 4) format as suggested at 46. Upon carrying through the action shown at either 45 or 46 the station processing apparatus returns to decision point 31 as suggested at 47.

Relative to selection of an "incoming" channel at 42 decision 43 evokes operation 48. In this operation a format control message is sent to the node at which the selected incoming channel originates. Such control messages are transmitted in control signalling channels in each station's bursts (for instance, in the "orderwire" control signalling channels described in the above-referenced Flemming patent). At the remote station (origin node) the format of the channel designated in the format control message communicated in operation 48 may be varied on a selective basis (to the expanded format of FIG. 4).

Operations at remote stations, in response to format control messages of the type represented at 38 and 48, are illustrated at 52 in FIG. 5b. The format control message is received in operation step 54 and a determination is made at 56 as to the type of action required. In respect to messages specifying reduction of designated outgoing data channels from expanded (protected) format to reduced format (FIG. 3 format), reformatting action 58 is taken directly. In respect to designated outgoing data channels requiring expansion to the protected format of FIG. 4, the station apparatus determines at 60 whether the available burst channel capacity is sufficient to accommodate the format change. If the burst channel capacity is insufficient, additional capacity is acquired as suggested at 62 and the expansion format change is carried out as suggested at 64. If sufficient capacity exists at decision point 60, the format change 64 is directly initiated.

Format Adaptation—Transmission

Figure 6:
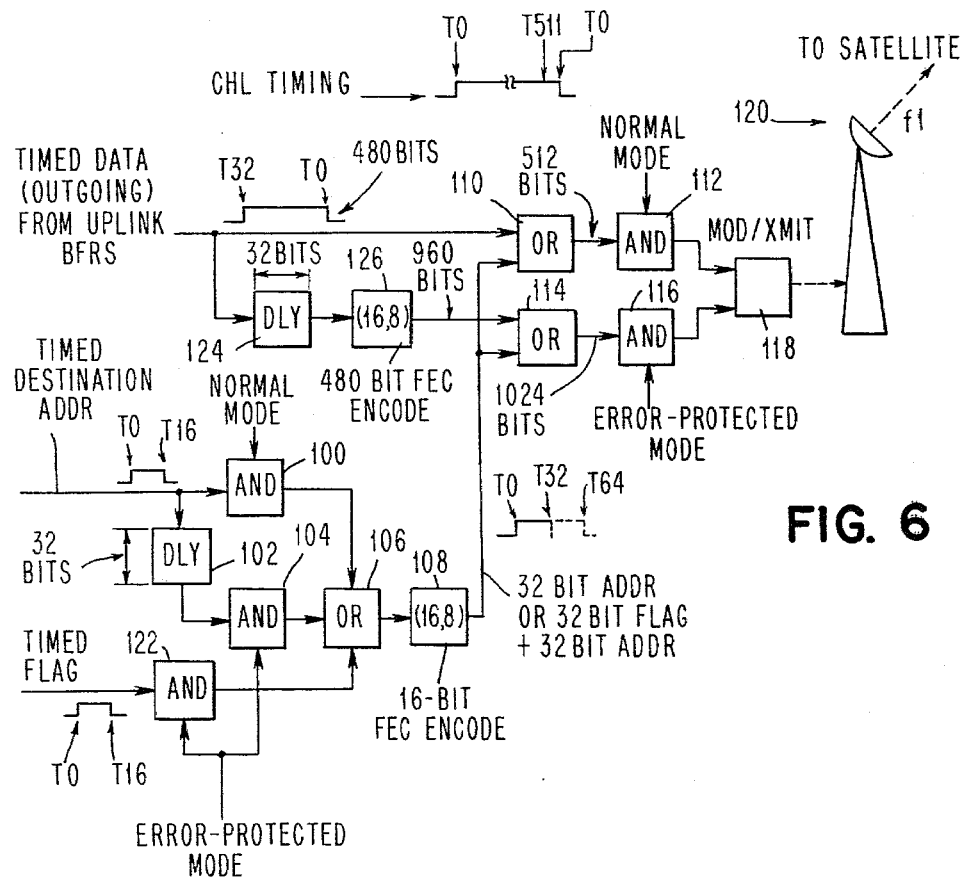
FIG. 6 illustrates station logic for controlling burst transmission formats selectively in accordance with the present invention.
Figure 7:
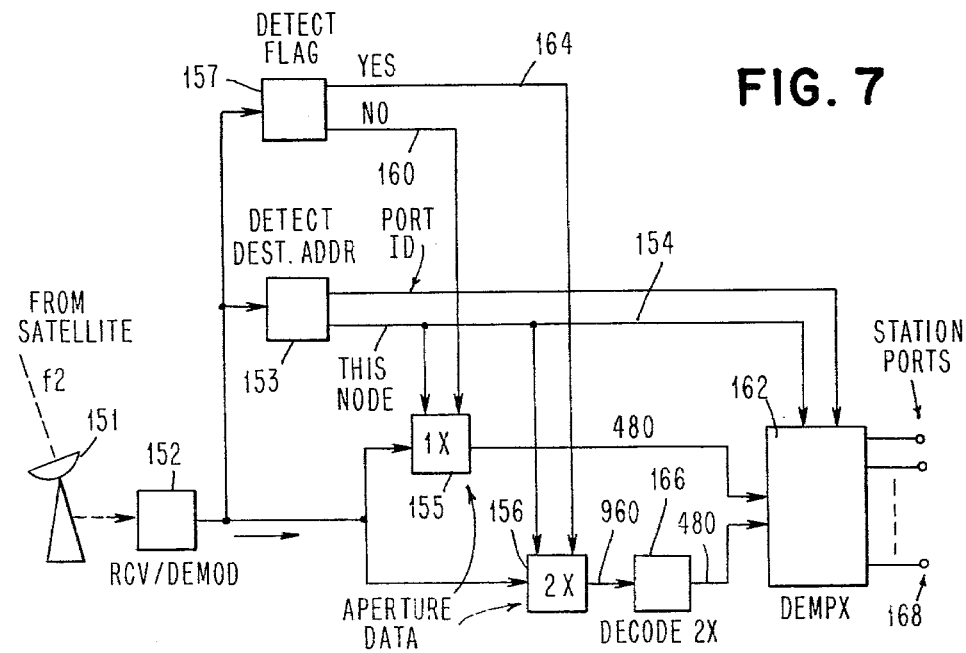
FIG. 7 illustrates station logic for controlling reception of varied channel formats in accordance witn the present invention.

Station apparatus required to sustain the format changes suggested in FIGS. 5a and 5b is illustrated in FIGS. 6 and 7. In transmission (outgoing) handling (FIG. 6) times T0 represent the beginnings of outgoing burst time channels (512 bit slots). The destination address for each outgoing channel is aplied in a 16 bit code configuration to AND circuit 100 and via a 32 bit delay 102 to AND circuit 104. Circuit 100 is enabled in normal mode (FIG. 3 format) and circuit 104 is enabled in protected mode (FIG. 4 format). Outputs of circuits 100 and 104 are passed via OR circuit 106 to the FEC encoder 108 which expands its 16 bit input to a 32 bit output in FEC code form. This 32 bit output is applied via OR circuit 110 to AND circuit 112 and via OR circuit 114 to AND circuit 116. AND circuit 112 is conditioned to pass its input from OR circuit 110 in normal mode (FIG. 3 mode) and AND circuit 116 is conditioned to pass its input from OR circuit 114 in error-protected mode (FIG. 4 mode). Outputs of AND circuits 112 and 116 are applied to modulation and transmitting circuits 118 associated with the burst transmission antenna 120 of the respective station.

Consequently, the 16 bit destination address received by AND circuits 100 and 104 is passed in a 32 bit FEC encoded representational form in either the first 32 bit slots of the current time channel (time slots T0 through T31), if AND circuits 100 and 112 are enabled, or in the next 32 bit slots (times T32 through T63) if AND circuits 104 and 116 are enabled.

In the error protected mode a 16 bit flag representation passed through AND circuit 122 and OR circuit 106 is translated by encoder 108 into a 32 bit FEC representational form in time coordination with the first 32 bit slots of the next outgoing burst time channel. In this same mode the output of encoder 108 is passed by OR circuit 114 and AND circuit 116 to the modulation and transmission apparatus 118 for transmission to the satellite. Consequently, in this mode the flag signal is explicitly transmitted in the first 32 bit slots of the burst channel in accordance with the format shown in FIG. 4, and serves to designate the associated format.

In time coordination with the remaining bit slots (T64 through T511) of the presently outgoing time channel, a block of 480 data bits is selected for transmission from not-shown uplink buffer stores. This data is passed by OR circuit 110 to AND circuit 112 and via 32 bit delay 124 to FEC encoder 126. The output of encoder 126 appears in the 960 bit FEC representational form of FIG. 4. The output of encoder 126 is passed by OR circuit 114 to AND circuit 116. Consequently, in normal mode, AND circuit 112 operates to pass data in the normal 480 bit representation form of FIG. 3 to the transmitting equipment 118 and 120, and in error-protected mode AND circuit 116 operates to pass data delayed by 32 bit slots, in the 960 bit protectively encoded form of FIG. 4, in two burst channels. The equipment 118, 120 thereby transmits either a destination address and 480 bits of data in the form suggested in FIG. 3 or a 32 bit flag representation followed by a destination address and 960 bits of data in the form shown in FIG. 4. In both forms the bits have the same timing and therefore the modulation bandwidth utilization is identical.

Reception Handling

As shown in FIG. 7, the composite of all bursts, as retransmitted by the satellite on carrier band F2, is received at antenna 151 and demodulated by reception and demodulation equipment 152. The destination address information in each channel designates a destination node (or plural nodes) and, where applicable, a specific destination port at the designated node. If the designed destination node matches the identity of the subject receiving node comparison circuit 153 elevates line 154 thereby partially enabling "1X" (480 bit) and "2X" (960 bit) data reception aperture gates 155 and 156 at the subject node. If a flag is not detected by circuits 157, line 160 is elevated completing the enablement of aperture gates 155 and permitting the accompanying 480 bits of data in the normal mode format of FIG. 3 to pass to the station demultiplexing equipment 162. If, however, the flag is detected by circuits 157, line 164 is elevated completing the enablement of data aperture gates 156 and thereby passing accompanying data, in the 960 bit error protected representational format of FIG. 4, to decoding circuits 166. Circuits 166 operate to translate the 960 bit FEC coded data into the original 480 bit representational form of the input to transmission encoder 126 (FIG. 6) for handling by the demultiplexing equipment 162. Equipment 162 completes the demultiplex handling of data relative to the station and its ports 168 as well as the conversion of any voice telephone samples to analogue form.

Other Applications

In addition to the foregoing application, of securing error-free transmission of data in selected multiplex communication channels under varying noise conditions, the subject invention is susceptible of beneficial application under other conditions. Assume for instance that station exchange apparatus such as 2a, 2b, 2c, ... (FIG. 1) is operated by a commercial common carrier for a service fee relative to paying subscribers/customers linked to associated ports 3a, 3b, 3c, ..., and assume that certain of such subscribers may at various time desire to have "assured" error-free transmission service (regardless of the condition of the communication path to the satellite). Obviously, data messages exchanged with such subscribers could, at the request of the subscriber, be protectively encoded on a per message basis (presumably for an additional service charge) by means of the foregoing invention. Such service would have obvious advantages to the subscriber in respect to cost benefits and performance advantages, inasmuch as all of the expense of protective encoding and data "retiming" would then be assumed by the common carrier.

While the invention has been particularly shown and described with reference to a preferred embodiment thereof, it will be understood by those skilled in the art that changes in form and details may be made therein without departing from the spirit and scope of the invention.

Having thus described our invention, what we claim as new, and desire to secure by Letters Patent is:

1. In a multiplex communication system:
   a first station;
   means at said first station for periodically transmitted signals representing information in multiple separate channels;
   a plurality of second stations individually adaptable to receive the information signals in various selected ones of said channels;
   means at said first station for adaptively varying the form of the transmitted signals representing the information in any one of said channels, from a first predetermined form to a second predetermined form and from said second form to said first form, said means being capable of varying the signal form in said any one channel without affecting the form of signals in other channels;
   means at said first station for transmitting control signals in association with each of said information channels, said control signals effectively designating the form and destination of the information representing signals in the associated channels in each period of transmission;
   means at each said second station for receiving said control signals; and
   means at each said second station, responsive to control signals which designate a destination in the respective second station for interpreting the form effectively designated by said control signals and for utilizing said interpretation for controlling the reception and selective utilization of information in the associated channels.

2. In a multiplex communication system according to claim 1, which includes means for distinguishing the quality of communication of information between said first station and any one of said second stations, the improvement comprising:
   first conditioning means at said first station associated with said quality distinguishing means for conditioning said form varying means to vary the form of the signals representing the information in selected ones of said information channels having one of said second stations as a destination, in order to sustain the quality of communication of information in said selected ones of said channels at a predetermined level independent of the quality of communication in other channels;
   second conditioning means at said first station, associated with said first conditioning means, for conditioning said control signal transmitting means to transmit control signals in association with said selected ones of said channels for distinguishing the form of the information signals in said selected ones of said channels at the same time that the form of said signals is altered.

3. A communication system according to claim 1 wherein:
   the signals transmitted by said varying means to represent information in said information channels consist variously of trains of digital bit signals having sub-trains of m bits and n bits; n and m being different integers; individual like-valued bit representations in said m bit and n bit sub-trains having identical forms and durations.

4. A method of communication comprising:
   periodically transmitting signals, representing information in multiple separate channels of information communication, from a first station to a plurality of second stations;
   varying the form of the transmitted signals representing the information in selected ones of said information channels and not in others of said channels;
   transmitting control signals in association with individual said channels for indicating the form of the associated information signals in each channel at all times;
   receiving said control signals at each of said second stations in association with the respective information representing signals; and
   using said control signals at each second station to recover information in channels having destinations in the respective second stations.

5. A communication method according to claim 4 including:
   distinguishing conditions temporarily having an adverse effect on the recoverability of information transmitted by said first station in channels having destinations in one of said second stations;
   varying the form of information signals transmitted by said first station in selected channels having destinations in said one of said second stations in a manner tending to sustain the recoverability of information in said selected channels at said one second station; and
   varying said control signals transmitted in association with said channels having destinations in said one second station to provide indications to said one second station of the immediate form of signals in each said channel in each said period of transmission.

6. A method of communicating multiplexed channels of information relative to various destinations in various formats comprising:
transmitting signals representing information in said channels from an origin station to a plurality of receiving stations;
arranging transmitted signals representing information in individual said information channels variously in a plurality of different signalling formats on a selective basis;
transmitting first control information signals in association with said individual channels for effectively designating destinations in particular receiving stations as destinations of respective channels; and
transmitting second control information signals in association with said first control signals for effectively designating the signalling formats in respective channels.

7. A method of multiplex communication in accordance with claim 6 wherein said second control information signals are implicity represented by said first control information signals when the format in the associated channel is a particular one of said plurality of formats.

8. A method of multiplex data transmission in accordance with claim 6 wherein said first and second control information signals are coded signals arranged in a predetermined error-protective code format.

9. A method of multiplex data transmission in accordance with claim 6 wherein the signals representing information in any one of said channels may be arranged variously, at different times, in a first error protected code format for avoiding errors due to noise and in a second unprotected format; and wherein the information in the second control information signals associated with said any one channel are arranged variously to distinguish the format of the information representing signals in said any one channel at all times.

10. A method of multiplex data transmission in accordance with claim 9 wherein information signals in said first format, which represent a single channel of information, occupy plural transmission channels, whereas signals in said second format which also represent a single channel of information occupy only a single transmission channel; and wherein said second control signals effectively distinguish the number of transmission channels occupied by the associated information channel representing signals.

11. A method of multiplex communication comprising:
transmitting signals representing information in a plurality of multiplexed information channels having different reception destinations; the signals representing individual ones of said information channels variously occupying single and plural signal communication channels;
transmitting first control signals in association with said information channels for effectively designating the destinations of associated information channels; and
transmitting second control signals in association with said first control signals for effectively designating the number of signal communication channels instantly occupied by the associated information channels.

12. A method in accordance with claim 11 including:
receiving said signals;
monitoring signals in certain of said channels for errors associatable with transient noise conditions; and
causing the number of signal communication channels allotted to one of said information channels selected on the basis of its information context to be varied conditionally in response to said monitored noise conditions in order to sustain accurate communication of the information in said one selected channel.

13. A method in accordance with claim 12 including:
varying the second control signals associated with said selected one of said information channels to indicate the number of signal channels instantaneously allotted to said one information channel; and
representing both the destination of said one information channel and the number of signal communication channels allotted thereto, by means only of said first control signals, whenever one particular predetermined number of signal channels is allotted to the one information channel, and at such times dispensing with the transmission of said second control signals in respect to said one channel.

14. In a TDMA communication system, in which multiple stations each transmit bursts containing time multiplexed channels of data from multiple sources for time-interleaved transfer through a common satellite repeater, said data channels having various demultiplexing destinations and having variously error-protected formats and unprotected formats, signals representing any one channel of data in said protected format occupying plural signal transmission channels and signals representing any one channel of data in said unprotected format occupying only one signal transmission channel, a method of burst transmission for use by any of said stations comprising:
transmitting first control information in said station bursts in association with said data channels for designating destinations of the associated data channels; and
transmitting second control information in said station bursts in association with said first control information for distinguishing the number of signal channels occupied by the signals representing the associated data channels.

15. A method of TDMA burst transmission in accordance with claim 14 comprising:
at a station receiving the bursts of multiple said station monitoring the bit error rate content of bursts transmitted by a particular one of said stations; thereby determining the transmission properties in the transmission path between the satellite repeater and said receiving station;
transmitting information indicating said properties from said receiving station to other stations currently transmitting data channels to said receiving station;
at any said other station causing the format of signals representing data in a selected data channel currently being transmitted from the respective station to said receiving station to be varied, in reaction to said transmitted transmission property information said selected channel being chosen on the basis of its information context; and
at said any other station causing the second control information associated with said selected channel to be varied so as to indicate the format of the data signals in the selected channel at all times.

16. A method of TDMA burst transmission in accordance with claim 15 comprising:

in respect to each data channel transmitted by said any other station and containing data signals in unprotected format, transmitting said first control information associated with the respective data channel in a predetermined part of the single transmission channel containing the associated data signals; said first control information having a form explicitly representing the destination of the associated data signals, and implicity representing the unprotected format of the associated data signals, thereby implicitly representing the second control information associated with the respective channel;

in respect to each data channel containing data signals in protected format, transmitting the associated second control information in a predetermined part of a predetermined one of the plural signal transmission channels containing the associated data signals; and in respect to each data channel in said protected format transmitting said first control information designating the associated destination in another predetermined part of said predetermined one of the plural signal transmission channels containing the associated data signals, said one and another predetermined parts being separate parts of said predetermined one of the plural channels.

17. A method of burst transmission in accordance with claim 16 comprising:

representing said first and second control information in one predetermined error-protective code format relative to all data channels.

18. In station apparatus, for controlling transmission of control information signals in separate multiplex channels, said control signals variously designating destinations of data signals accompanying said control signals in associated channels, the improvement comprising:

means for conditionally varying the format of data in certain of said channels, but not in other channels on a selective basis, to sustain accurate communications of data in said certain channels under varying noise conditions while allowing data in said other channels to be communicated with varying accuracy; and means associated with said format varying means for varying said control information signals to distinguish said format variations in associated data.

19. In station apparatus in accordance with claim 18 including:

means for distinguishing transient noise conditions; and means for distinguishing the type of data currently being transmitted in each of said channels; the improvement of:

means associated with said distinguishing means for conditioning said format varying means and said control signal varying means to vary the format of data in selected said channels, in reaction to said noise conditions, and the form of control signals transmitted in association with said selected channels for providing immediate indications to other stations of format variations in the selected channels.

20. In a TDMA communication system in which multiple stations transmit bursts of time multiplexed information signal channels, for time interleaved transfer to other stations via a common satellite repeater, said channels containing data having various destinations to particular other stations and various demultiplexing destinations in said particular other stations, data in individual said channels being arranged variously in error-protected code formats and unprotected formats, data in said unprotected format occupying single said channels and data in said protected format occupying pairs of contiguous said channels; data in both of said formats being transmitted at identical bit rates; transmission control apparatus for use in any of said stations comprising:

a source of blocks of data signals arranged in unprotected format and capable of being transmitted to said repeater in single multiplex channels of a said burst;

means associated with said source for translating data signals in selected ones of said blocks into error-protected format in association with varying noise conditions in a burst transmission path between one of said stations and the repeater;

means for combining data block outputs of said source and translating means for multiplexed transmission to said repeater in various channels of a burst; said blocks in unprotected format occupying single transmission channels in said burst and blocks in protected format occupying pairs of transmission channels; and means associated with said combining means for producing control information signals represented in an error-protected code format for transmission to said repeater in said burst in association with said data blocks; said control signals designating the destinations and formats of the associated data blocks.

21. Transmission control apparatus in accordance with claim 20 wherein the information in said control signals associated with each data block transmitted in said unprotected format consists of address code information explicitly designating the destination of the associated data block and implicitly distinguishing the format of said data block as unprotected; said address information being transmitted with the associated data block in the channel containing said data block.

22. Apparatus in accordance with claim 21 wherein said control signals transmitted in association with each said data block transmitted in protected format in a pair of said channels, comprises flag information and destination address information transmitted in one channel of the same pair of channels, said flag information being represented in the same code format as said address information associated with data in unprotected format and occupying a predetermined channel location in transmission; the coding of said flag information serving to explicitly distinguish the error-protected paired-channel format of the associated data.

23. Apparatus in accordance with claim 22 wherein said address signals accompanying a data block having unprotected format is transmitted in a predetermined location in the channel containing the associated data block; and wherein each of said flag signals accompanying a data block having protected format is transmitted in one channel of the pair of channels containing the associated data block in a location corresponding to the predetermined location occupied by said address signals accompanying unprotected data.

* * * * *